United States Patent
Schmit et al.

(10) Patent No.: US 9,582,349 B1
(45) Date of Patent: Feb. 28, 2017

(54) METHODS AND APPARATUS FOR DETECTING MEMORY BIT CORRUPTION ON AN INTEGRATED CIRCUIT

(71) Applicant: Altera Corporation, San Jose, CA (US)

(72) Inventors: Herman Henry Schmit, Palo Alto, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 41 days.

(21) Appl. No.: 14/464,244

(22) Filed: Aug. 20, 2014

(51) Int. Cl.
  *G06F 11/07* (2006.01)
  *G06F 11/22* (2006.01)

(52) U.S. Cl.
  CPC ........ *G06F 11/0763* (2013.01); *G06F 11/073* (2013.01)

(58) Field of Classification Search
  CPC .. G06F 11/0763; G06F 11/073; G06F 11/085; G11C 29/50
  See application file for complete search history.

(56) References Cited

U.S. PATENT DOCUMENTS

| | | | | |
|---|---|---|---|---|
| 4,875,212 A * | 10/1989 | Hashimoto | ......... | G06F 11/1076 714/764 |
| 5,243,293 A | 9/1993 | Isozaki et al. | | |
| 5,710,515 A * | 1/1998 | Teggatz | ................. | G01K 7/01 257/E23.08 |
| 5,714,905 A * | 2/1998 | Galli | .................. | H03F 1/52 327/538 |
| 5,982,305 A * | 11/1999 | Taylor | ................ | H03H 17/0685 341/50 |
| 6,593,751 B2 | 7/2003 | Takahashi | | |
| 6,795,342 B1 * | 9/2004 | He | ..................... | G11C 16/10 365/185.16 |
| 8,415,974 B1 * | 4/2013 | Lysaght | .......... | H03K 19/17752 326/39 |
| 8,773,164 B1 * | 7/2014 | Gaide | ............. | H03K 19/17736 326/38 |
| 8,909,941 B1 * | 12/2014 | Trimberger | ............ | G06F 21/64 713/190 |
| 2004/0004880 A1 * | 1/2004 | Yoon | ...................... | G11C 11/39 365/205 |
| 2005/0169095 A1 * | 8/2005 | Bedeschi | ................ | G11C 7/12 365/232 |
| 2010/0052798 A1 * | 3/2010 | Hirai | .................... | H03L 7/0995 331/34 |

(Continued)

*Primary Examiner* — April Y Blair
*Assistant Examiner* — Dipakkumar Gandhi
(74) *Attorney, Agent, or Firm* — Michael H. Lyons

(57) ABSTRACT

An integrated circuit may have a memory bit corruption detection circuit. The memory bit corruption detection circuit may monitor a circuit that stores multiple data bits using a current sensing circuit and a fault detection circuit. When a bit of the data bits gets corrupted, a current may flow through a predetermined node in the monitored circuit which may be sensed by the current sensing circuit. The current may have a particular current profile that may be distinguishable from current flows that occur during normal operation of the monitored circuit. The fault detection circuit may recognize the particular current profile that is indicative of a corrupted memory bit in the monitored circuit and generate a fault signal to indicate that memory bit corruption has occurred in the monitored circuit.

24 Claims, 11 Drawing Sheets

(56) References Cited

U.S. PATENT DOCUMENTS

| | | | |
|---|---|---|---|
| 2010/0162067 A1* | 6/2010 | Norman | G11C 11/56 |
| | | | 714/746 |
| 2012/0092042 A1* | 4/2012 | Takei | G11C 27/024 |
| | | | 327/94 |
| 2012/0313801 A1* | 12/2012 | Maejima | H03M 1/366 |
| | | | 341/155 |
| 2014/0168843 A1 | 6/2014 | Privitera et al. | |
| 2014/0184200 A1 | 7/2014 | Milano et al. | |
| 2014/0241036 A1* | 8/2014 | Toda | G11C 13/0069 |
| | | | 365/148 |

* cited by examiner

METHODS AND APPARATUS FOR DETECTING MEMORY BIT CORRUPTION ON AN INTEGRATED CIRCUIT

BACKGROUND

This invention relates to memory bit corruption and, more particularly, to detecting memory bit corruption in integrated circuits.

Integrated circuits often contain memory elements. Typical memory elements are based on cross-coupled inverters (latches) and are used to store data. Each memory element can store a single bit of data.

Memory elements are often used to store configuration data in integrated circuits. For example, memory elements may be used to store configuration data in programmable logic device integrated circuits. Programmable logic devices are a type of integrated circuit that can be customized in relatively small batches to implement a desired logic design. In a typical scenario, a programmable logic device manufacturer designs and manufactures un-customized programmable logic device integrated circuits in advance. Later, a logic designer uses a logic design system to design a custom logic circuit.

The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit.

Integrated circuits such as programmable logic devices are subject to a phenomenon known as single event upset (SEU). A single event upset is a change of state caused by ions or electro-magnetic radiation. Cosmic rays or radioactive impurities embedded in integrated circuits and their packages may be responsible for generating such ions or electro-magnetic radiation.

When ions or electro-magnetic radiation strike the silicon substrate on which the integrated circuit is implemented, electron-hole pairs are generated. The electron-hole pairs create a conduction path that can cause a charged node for example a memory element to discharge. Thus, a single event upset may cause a logic "1" in the memory element to chance to a logic "0".

Upset events in sequential elements (e.g., memory elements, latches, or registers) can have serious repercussions and various error detection techniques have been examined and implemented in modern integrated circuits to address this issue. Typically, error detection techniques involve comparing the state of the sequential elements to their original state, and restoring them to the original state if a memory bit has been corrupted. However, such error detection techniques may not be applied instantaneously, and therefore there may be a risk that an integrated circuit operates with corrupted memory bits for at least some duration of time.

SUMMARY

In accordance with certain aspects of the invention, an integrated circuit may include a monitored circuit, a current sensing circuit, and a fault detection circuit. The monitored circuit may store a plurality of data bits. When a bit of the plurality of data bits gets corrupted, a current may flow through a predetermined node in the monitored circuit. The current sensing circuit that monitors the current flow through the predetermined node in the monitored circuit may generate a current detection signal based on the monitored current flow, and the fault detection circuit that receives the current detection signal from the current sensing circuit may generate a fault signal based on the received current detection signal.

It is appreciated that the present invention can be implemented in numerous ways, such as a process, an apparatus, a system, a device, or instructions on a computer readable medium. Several inventive embodiments of the present invention are described below.

In certain embodiments, the above-mentioned current sensing circuit may include a current mirror or a voltage divider.

If desired, the integrated circuit may further include an additionally monitored circuit that stores an additional plurality of data bits and causes an additional current flow through a predetermined node in the additionally monitored circuit when a bit of the additional plurality of data bits is corrupted.

The current sensing circuit may additionally monitor the current flow through the predetermined node in the additionally monitored circuit and generate the current detection signal based on the additionally monitored current flow.

An additional current sensing circuit may monitor the current flow through the predetermined node in the additionally monitored circuit and generate an additional current detection signal based on the monitored current flow. The fault detection circuit may receive the additional current detection signal from the additional current sensing circuit and generate a fault signal based on the received additional current detection signal.

Further features of the invention, its nature and various advantages, will be more apparent from the accompanying drawings and the following detailed description of the preferred embodiments.

DETAILED DESCRIPTION

The present invention relates to memory bit corruption and, more particularly, to detecting memory bit corruption in integrated circuits (ICs).

The embodiments described herein disclose circuits and techniques for reducing the duration of time that is needed to detect a corrupted memory bit in an integrated circuit.

The embodiments described herein disclose circuits and techniques to check for the symptoms of a memory bit corruption rather than checking for the state of the sequential elements, and thereby, reduce the duration of time that is needed to detect a corrupted memory bit in an integrated circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
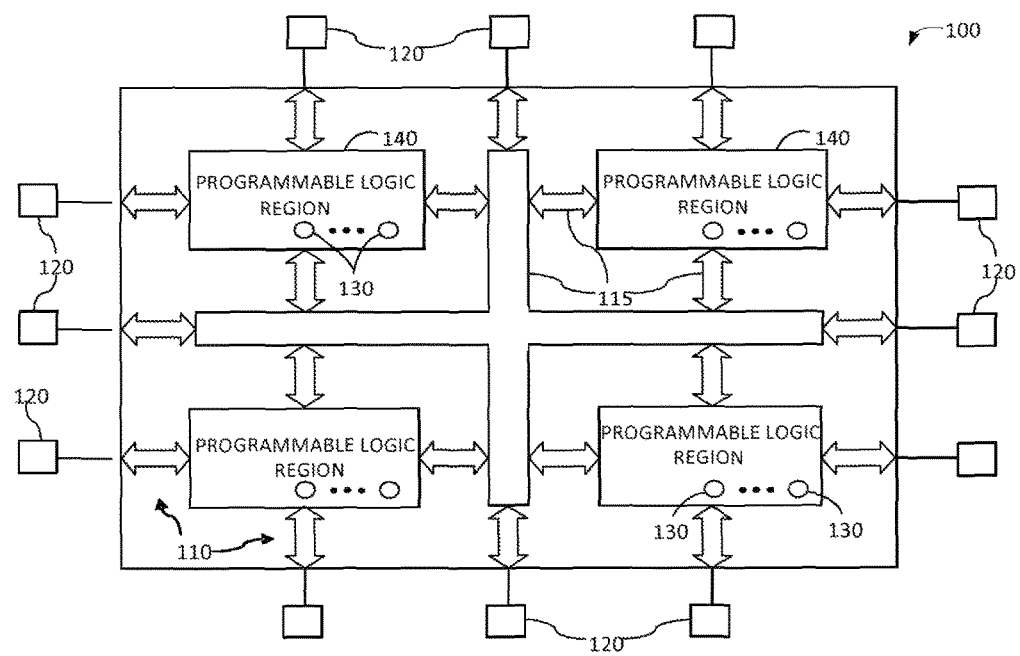
FIG. 1 is a diagram of an illustrative integrated circuit with memory elements in accordance with an embodiment.

An illustrative embodiment of an integrated circuit such as a programmable logic device (PLD) 100 in accordance with an embodiment is shown in FIG. 1.

Programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry such as configurable register circuitry. As an example, the configurable register circuitry may operate as a conventional register. Alternatively, the configurable register circuitry may operate as a register with error detection and error correction capabilities.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop-circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM (CRAM), or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

The corruption of a memory element may modify the functionality of the programmable logic device as implemented by the loaded configuration data. Such a corruption may for example cause a current flow in a node within the memory element or adjacent to the memory element. Such a current flow may be symptomatic for a corrupted memory element and monitoring the node and detecting the current may enable the detection of the corrupted memory element.

For example, a memory bit corruption detector may monitor all programmable interconnects 115 in the programmable logic device 100. The corruption of a memory element in a programmable interconnect 115 may cause a short circuit to flow through an observable node, which one of the memory bit corruption detectors may defect. Such a detector may use a small amount of circuit area and all detectors may work in parallel.

Figure 2:
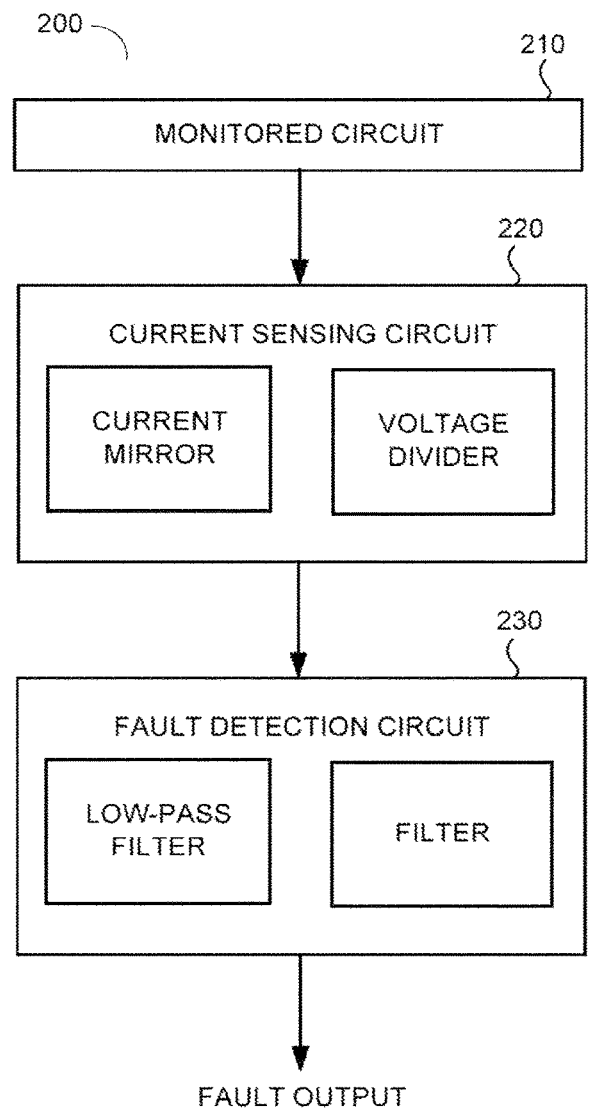
FIG. 2 is a diagram of an illustrative memory bit corruption detector in accordance with an embodiment.

FIG. 2 is a diagram of an illustrative memory bit corruption detector in accordance with an embodiment. As shown, the memory bit corruption detector may include a monitored circuit 210, a current sensing circuit 220, and a fault detection circuit 230. The current sensing circuit may monitor the current flow through an observable node of monitored circuit 210.

In the event of a memory bit corruption in the monitored circuit 210, the current sensing circuit 220 may reproduce the current profile of the current flow through the observable node in another circuit using a current mirror or a voltage divider.

Fault detection circuit 230 may receive the reproduced current profile from current sensing circuit 220. Fault detection circuit 230 may analyze the reproduced current profile to determine whether a memory bit in the monitored circuit 210 has been corrupted. For example, a corrupted memory bit in the monitored circuit 210 may cause a short circuit current in the observable node.

Fault detection circuit 230 may distinguish a short circuit current profile from a current that flows through the observable node during normal operation and that is not indicative of a corrupted memory bit. For example, the current sensing circuit may detect only current spikes of a relatively short duration of time in the observable node during normal operation. In one embodiment, a low-pass filter may suppress these short current spikes while letting the short circuit currents of a comparably long duration of time pass through for detection by the fault detection circuit.

If desired, the current sensing circuit may be configurable such that only those current spikes are detected that exceed a predetermined detection threshold. The predetermined detection threshold may be defined by a peak current value, a current duration, etc. or combinations thereof.

In response to detecting a predetermined current profile indicative of a corrupted memory bit at the observable node of the monitored circuit 210, fault detection circuit 230 may generate a signal that indicates that a memory corruption fault was detected.

Figure 3:
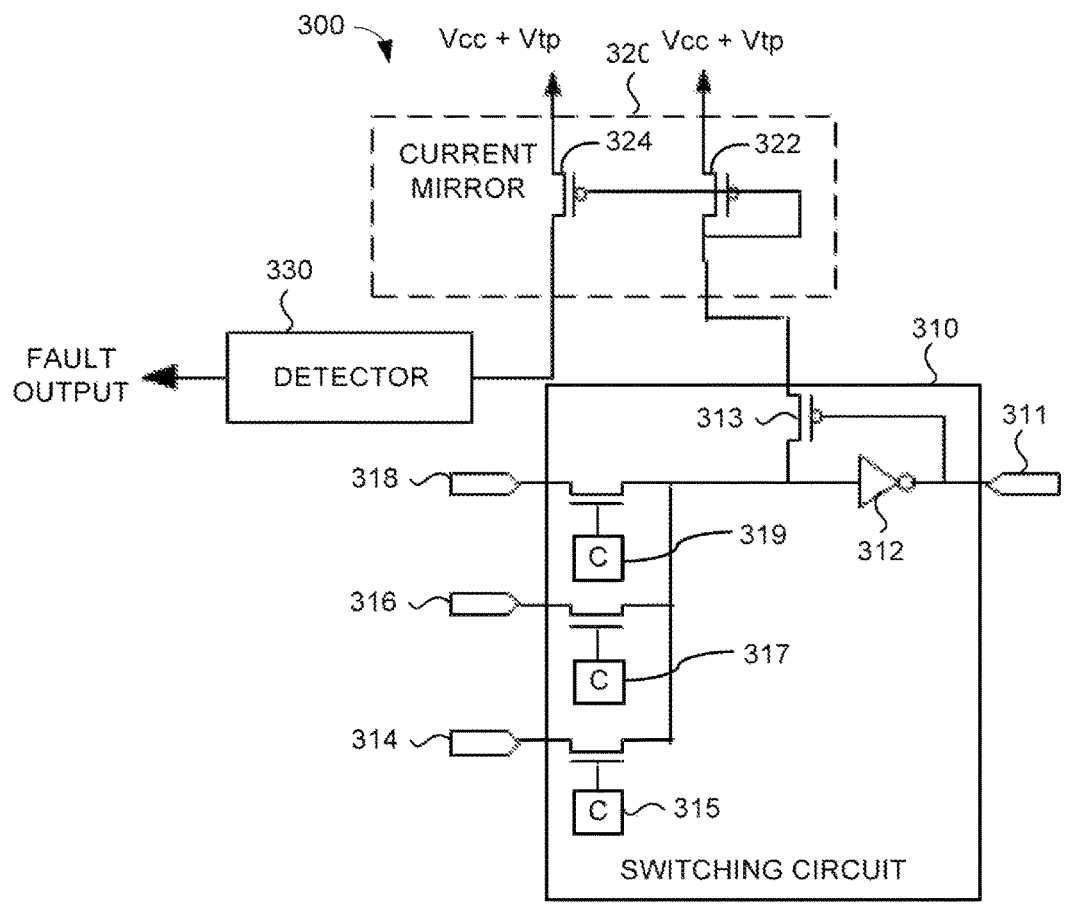
FIG. 3 is a diagram of an illustrative current mirror that monitors current flow in an internal node of a switching circuit to detect memory bit corruption in the switching circuit's configuration memory in accordance with an embodiment.

The memory bit corruption detector may detect any memory bit corruption that causes a short circuit. As a example, FIG. 3 shows a switching circuit 310 (e.g., a routing multiplexer) that is monitored by current mirror 320 and detector 330.

Switching circuit 310 may be a one-hot, fully decoded routing multiplexer that has three inputs 314, 316, and 318, one output 311, three pass transistors each being controlled by a memory element (i.e., memory elements 315, 317, and 319), a weak PMOS pull-up transistor 313, and an inverter 312.

The pass transistors connect the inputs 314, 316, and 318 to the input of inverter 312. Weak PMOS pull-up transistor 313 is coupled between the inverter input and output to restore the voltage level at the inverter input, which may have dropped because of the pass transistors. In fact, the pass transistors may turn off as the voltage at the inverter input approaches a voltage level that corresponds to the supply voltage minus the threshold voltage of the past transistor. To minimize this effect, the memory elements may store a boosted gate voltage Vcchg, which it higher than the supply voltage Vcc.

Switching circuit 310 is merely illustrative and not intended to limit the scope of the invention. If desired, switching circuit 310 may have any number of inputs. These inputs may be arranged in different ways. For example, switching circuit 310 may have all inputs arranged in parallel. Alternatively, switching circuit 310 may include multiple multiplexing stages, which may be cascaded.

As shown, switching circuit 310 includes NMOS pass transistors that are controlled by memory elements and thus logic "1" stored in the corresponding memory elements may create a conductive connection between source and drain of the respective NMOS transistor. If desired, PMOS pass transistors that are controlled by memory elements may be used as well. In this case, logic "0" stored in the corresponding memory elements may create a conductive connection between source and drain of the respective PMOS transistor.

Switching circuit 310 may have an additional inverter (not shown) coupled between the output of inverter 312 and output 311 to restore the original polarity of a signal received at one of the inputs.

When the switching circuit 310 is in use, only one of the three memory elements 315, 317, and 319 may store logic "1" while the other two memory elements store logic "0" to prevent a short circuit current between two inputs. Thus, exactly one input of inputs 314, 316, and 318 is connected through the respective pass transistor and inverter 312 to output 311. When the switching circuit 310 is not in use, all three memory elements 315, 317, and 319 may store logic "0", thereby effectively decoupling inputs 314, 316, and 318 from output 311.

As an example, consider the scenario in which memory element 319 stores logic "1" and memory elements 315 and 317 store logic "0". In this scenario, a signal that arrives at input 318 is routed to output 311.

Consider further that the signal at input 318 is logic "0". If the input to inverter 312 was logic "1" before, then a current flows from the input of inverter 312 through the pass transistor to a ground connection. In response to discharging the input of inverter 312, the output of inverter 312 switches from logic "0" to logic "1", which may turn the weak PMOS pull up transistor 313 off. During the transition of the inverter output from logic "0" to logic "1", a current may flow through the weak PMOS pull-up transistor 313. This current may only last for a short duration of time (e.g., less than 100 ps).

Consider next that the signal at input 318 is logic "1". If the input to inverter 312 was logic "0" before, then a current flows from input 318 to the input of inverter 312 through the pass transistor. In response to charging the input of inverter 312, the output of inverter 312 switches from logic "1" to logic "0", which may turn the weak PMOS pull-up transistor 313 on. As a result, a current may flow through the weak PMOS pull-up transistor 313 and restore the voltage level, which may have dropped because of NMOS pass transistor between input 318 and the input of inverter 312. This current may only last for a short duration of time (e.g., less than 100 ps).

Consider now, that a single-event upset (SEU) corrupts memory element 317. A corresponding waveform diagram is shown in FIG. 6 with CRAM0 and CRAM1 representing the voltages at memory elements 319 and 317, respectively, INPUT0 and INPUT1 representing the voltages at inputs 318 and 316, respectively, and INV_IN representing the voltage at the input of inverter 312.

Figure 6:
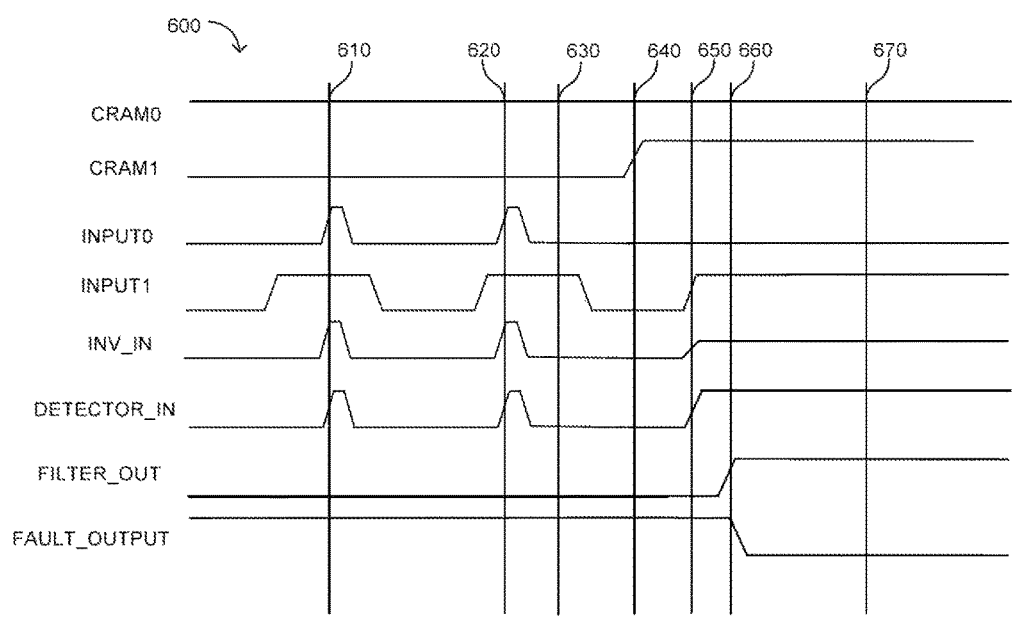
FIG. 6 is a diagram of an illustrative waveform diagram that shows the generation of the fault signal based on a configuration memory bit corruption in accordance with an embodiment.

As shown in FIG. 6 at time 640, the single-event upset causes the state of the signal stored in memory element 317 to flip from logic "0" to logic "1". Thereby, the corrupted memory element 317 may cause a conducting path from the previously decoupled input 316 through the NMOS pass transistor to the input of inverter 312 and from there through the NMOS pass transistor controlled by memory element 319 to input 318. As an example, consider that the signal at input 318 is logic " " (e.g., INPUT0 at time 640 in FIG. 6) and the signal at input 316 switches from logic "0" to logic "1" (e.g., INPUT1 at time 650).

In this event, a short circuit current may flow from input 318 through the NMOS pass transistors controlled by memory elements 319 and 317 to input 316, and the two NMOS pass transistors may act as a voltage divider such that the voltage at the drain of the weak PMOS pull-up transistor 313 is approximately half the supply voltage (e.g., INV_IN in FIG. 6 which passes from logic "0" to approximately half of supply voltage Vcc at time 650).

As a result, the transistors of inverter 312 may both be turned on, leaving output 311 in a state between supply voltage Vcc and ground voltage GND as well, which may cause a current to flow through the weak PMOS pull-up transistor 313. Detector 330 may detect the current draw that occurs as a result of the short circuit between inputs 316 and 318.

However, placing a current sensing circuit on inverter 312 may reduce the performance of switching circuit 310. In addition, the current ordinarily sourced by switching circuit 310 may drive a large capacitance which may lead to a high current flow through inverter 312 during normal operation, which may increase the difficulty to distinguish a failure from ordinary high activity during normal operation. The weak PMOS pull-up transistor 313, however, is not on a performance critical path. Additionally, the current flow through weak PMOS pull-up transistor 313 is small compared to the current flow through inverter 312. Thus, a current sensing circuit may be built as part of the weak PMOS pull-up transistor 313.

The current sensing circuit may be implemented in number of ways. For example, as shown in the embodiment of FIG. 3, two PMOS transistors 322 and 324 may be arranged in parallel to form a current mirror. PMOS transistors 322 and 324 may both have their source connected to the power supply and their gates tied to the source node of the weak PMOS pull-up transistor 313. Because the PMOS transistors 322 and 324 may turn OFF when the voltage between their gate and source (Vgs) approaches the threshold voltage Vtp, the supply voltage for the current mirror may be held at Vcc+Vtp.

Figure 4:
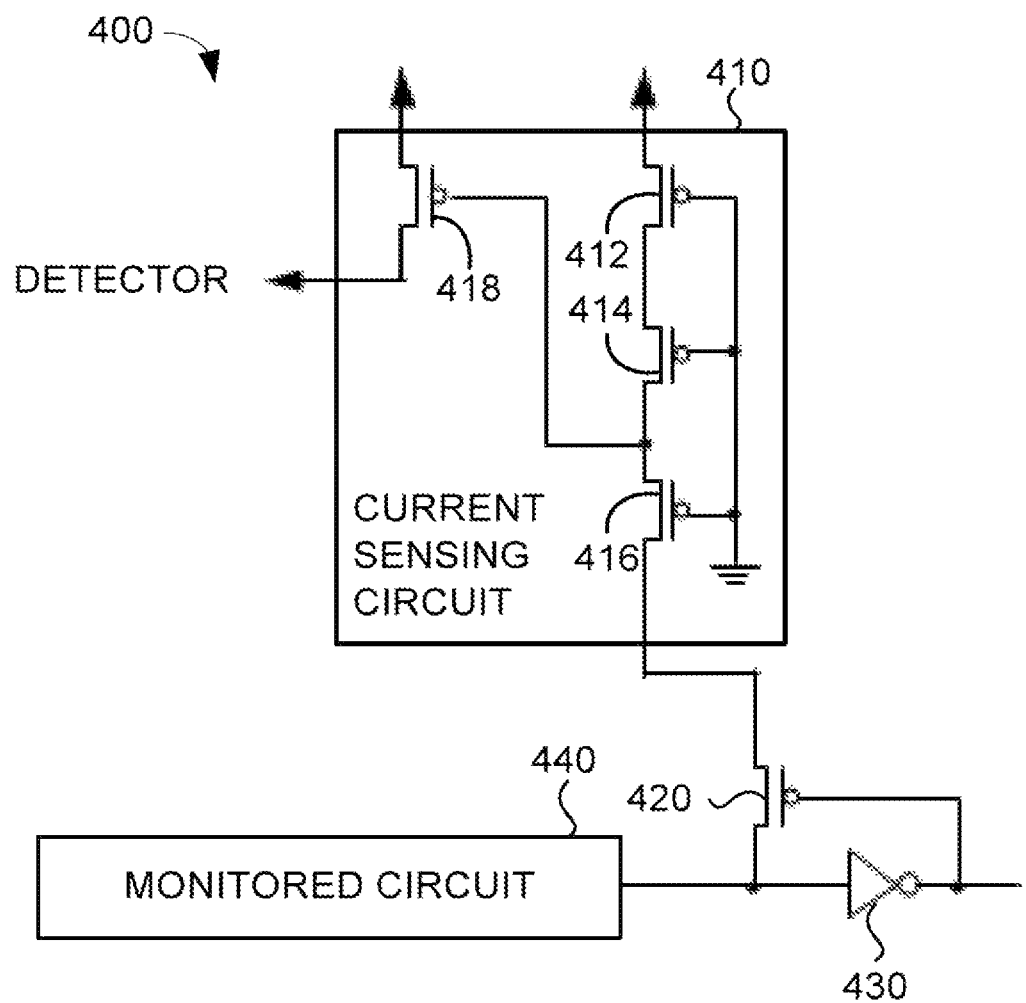
FIG. 4 is a diagram of an illustrative current sensing circuit based on a voltage divider in accordance with an embodiment.

FIG. 4 shows another embodiment of a current sensing circuit that is based on a voltage divider. Similar to the current mirror 310 of FIG. 3, current sensing circuit 410 is monitoring the current flowing through weak PMOS pull-up, transistor 420. Similar to weak PMOS pull-up transistor 320 of FIG. 3, weak PMOS pull-up transistor 420 may serve to restore the voltage level between monitored circuit 440 and inverter 430.

The voltage divider created by the series of PMOS transistors 412, 414, and 416 may turn PMOS transistor 418 OFF for as long as the weak PMOS pull-up transistor 420 remains OFF. However, when current flows through weak PMOS pull-up transistor 420, the voltage at the source of PMOS transistor 416 may drop below the threshold voltage that may turn PMOS transistor 418 ON and, as a result a current may flow from the supply voltage to the detector.

If desired, the current sensing circuit may have more or less than three PMOS transistors in series. For example, current sensing circuit 410 may have two, four, five, or more PMOS transistors in series.

The detector (e.g., detector 330 in FIG. 3) may receive current DETECTOR_IN (see FIG. 6) from the current sensing circuit current (e.g., current mirror 320 of FIG. 3 or current sensing circuit 410 of FIG. 4). However, every change in polarity of the signal at input 318 may cause a temporary high current on the weak PMOS pull-up transistor 313 which current mirror 320 may reproduce at the input of detector 330, even during normal operation, before corruption of memory element 317 (e.g., as illustrated in FIG. 6 by transitions of INPUT0 and DETECTOR_IN at times 610 and 620).

Therefore, detector 330 may need to distinguish. between a transient current spike due to normal operation (e.g., at times 610 and 620), and a long term current draw that is indicative of a short circuit (e.g., at time 650). Typically, a transient current spike may last less than 100 ps, while a short circuit current will last a clock cycle or more (e.g., more than 2 ns).

Figure 5:
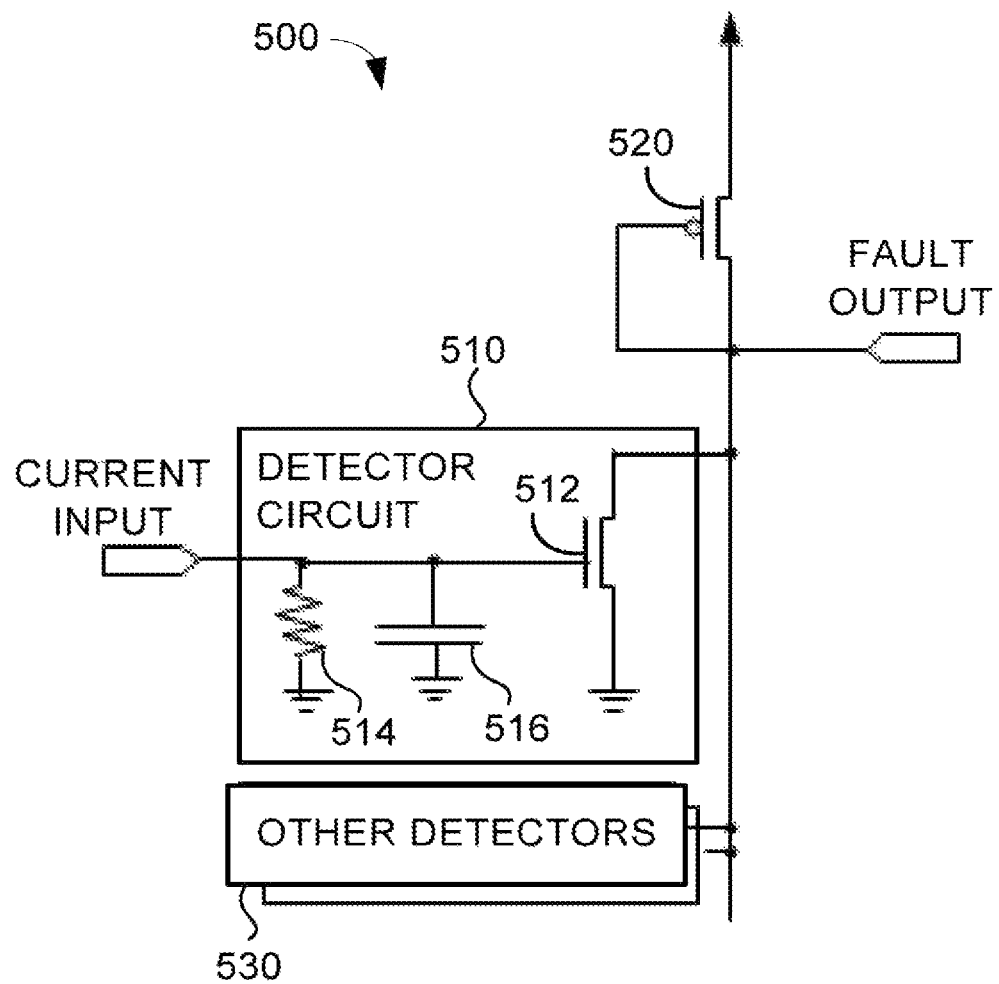
FIG. 5 is a diagram of an illustrative detector circuit with a low-pass filter coupled together with other detectors to generate a fault signal in accordance with an embodiment.

An embodiment of detector 330 is shown. in FIG. 5. As shown, detector circuit 510 may include NMOS transistor 512 coupled to a low-pass filter built from resistor 514 and capacitor 516. The current (e.g., from current mirror 320 or current sensing circuit 410) may reach the low-pass filter in detector circuit 510 through the current input. The low-pass filter may filter out the transient current spikes as illustrated by signal FILTER_OUT at times 610 and 620 in FIG. 6. However, low-pass filter may let pass the low frequency behavior of a short circuit current as illustrated by the transition of signal FILTER_OUT from logic "0" to logic "1" at time 660.

The voltage of capacitor 516 is fed to the gate of NMOS transistor 512. As a result, NMOS transistor 512 may turn ON and pull the FAULT OUTPUT node towards the ground voltage GND as illustrated by signal FAULT_OUTPUT at time 666 in FIG. 6, against PMOS transistor 520 which may pull the voltage up. Thus, PMOS transistor 520 may be weak compared to NMOS transistor 512. This structure may allow that multiple other detectors 530 are wired in parallel with detector circuit 510, thereby forming a logic OR function of short circuit currant detectors 510 and 530.

Figure 7:
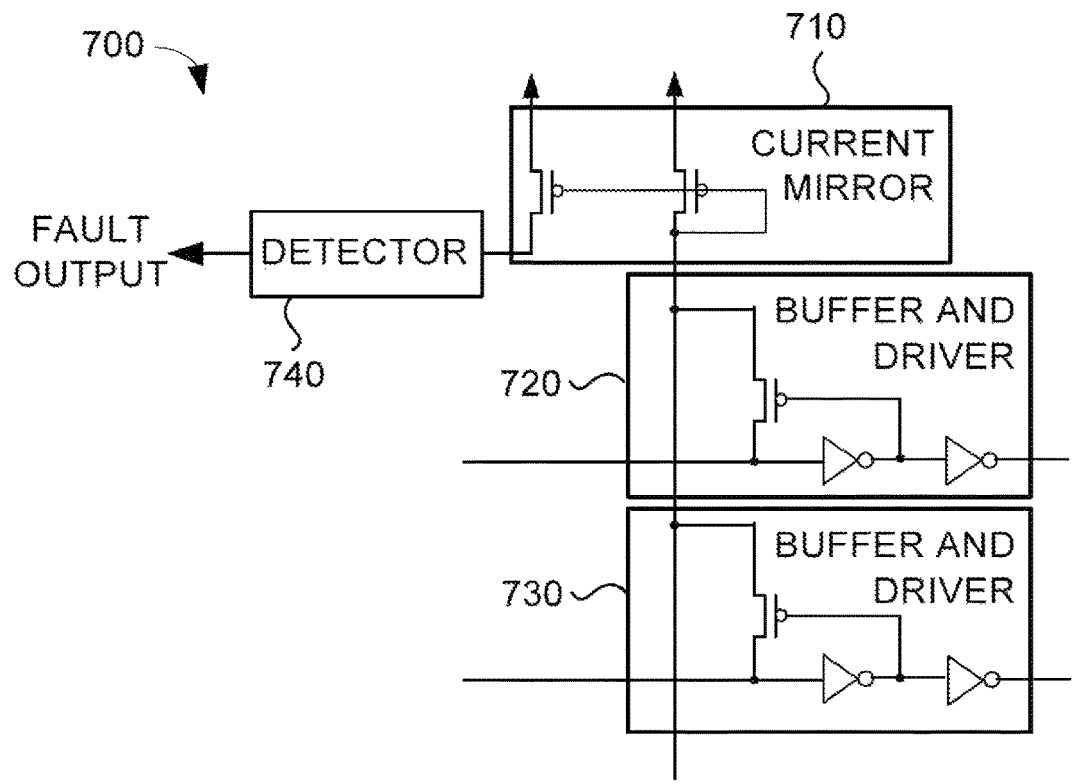
FIG. 7 is a diagram of an illustrative memory bit corruption detector that monitors two buffer and driver circuits in accordance with an embodiment.

Similarly, multiple circuits may be monitored by one current sensing circuit and one detector circuit. An embodiment of such an arrangement in which buffer and driver circuits 720 and 730 share one current sensing circuit and one detector circuit is shown in FIG. 7. As shown, the source terminal of the weak PMOS pull-up transistor in buffer and driver circuits 720 and 730 may connect to current mirror 710.

A short circuit current through one of the weak PMOS pull-up transistors may draw the voltage of the source terminal of the respective weak PMOS pull-up transistor down such that the PMOS transistors in current mirror 710 turn ON, and a current flows from the supply voltage to detector 740.

Using a shared current sensing circuit and a shared detector circuit to monitor multiple circuits may reduce the total detector cost. However, the number of circuits that a shared current sensing circuit and a shared detector circuit may monitor may be limited by the ability of the detector circuit's low-pass filter to distinguish between more high-frequency transient current spikes caused by normal operation of the monitored circuits and a low-frequency short circuit current caused by memory bit corruption.

For example, the number of monitored circuits that may share a current sensing circuit and a detector circuit may be determined by the duration of transient current spike compared to the minimum duration of a short circuit current. As an example, consider that the duration of a transient current spike and the minimum duration of a short circuit current are 100 picoseconds (ps) and 2 nanoseconds (ns), respectively. Consider further that 20 monitored circuits share a current sensing circuit and a detector circuit. In this example, the sum of the transient current spikes (20*100 ps=2 ns) would appear to be a short circuit current, and the detection strategy would fail.

Figure 8:
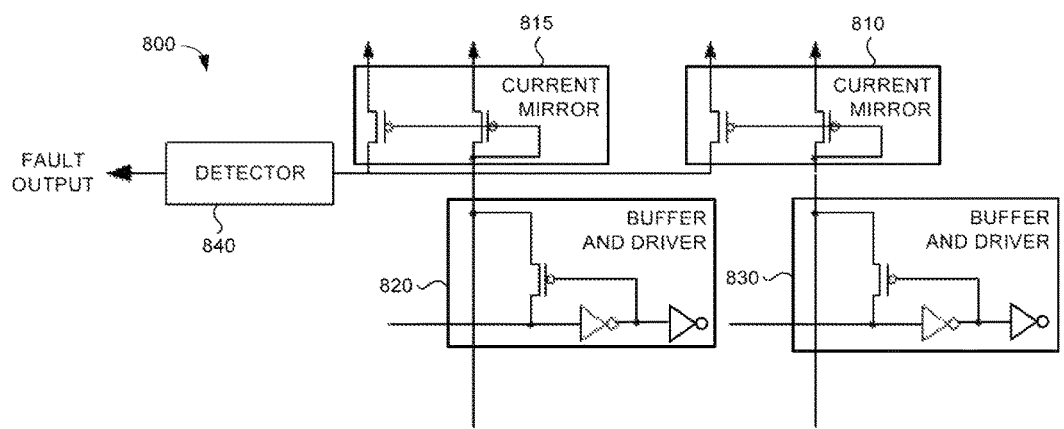
FIG. 8 is a diagram of an illustrative memory bit corruption detector with two current mirrors each monitoring one circuit in accordance with an embodiment.

FIG. 8 shows another embodiment of multiple monitored circuits that each have a current sensing circuit, but the current sensing circuits share a detector circuit to amortize the cost of the detector circuit over multiple monitored circuits.

As shown in FIG. 8, each of the buffer and driver circuits 820 and 830 are coupled to a different current sensing circuit such as current mirrors 815 and 810, respectively. Each of the current mirrors 810 and 815 may have two PMOS transistors, similar to current mirror 320 in FIG. 2. A short circuit current through one of the weak PMOS pull-up transistors in buffer and driver circuit 820 or 830 may cause a voltage drop at the source terminal of that weak PMOS pull-up transistor and thus a current to flow from the voltage supply through the respective current mirror to detector 840.

Similar to FIG. 7, the number of monitored circuit and current sensing circuit pairs in FIG. 8 that may share a detector circuit 840 may be determined by the duration of the transient current spike compared to the minimum duration of a short circuit current.

The embodiment described in FIG. 3 may detect a transition from a legal state in which a memory element (e.g., memory element 319) enables a single pass transistor to the illegal state in which two memory elements (e.g., memory elements 317 and 319) enable two pass transistors leading to the flow of a short circuit current from one input (e.g., input 316) to another input (e.g., input 318). In a different scenario, a memory element (e.g., memory element 319) may enable a single pass transistor, and the corruption of that memory element may disable that pass transistor. In this different scenario, the corrupted memory element 319 may cause a stuck-at fault at output 311, which may be undetectable by the embodiment described in FIG. 3.

Figure 9:
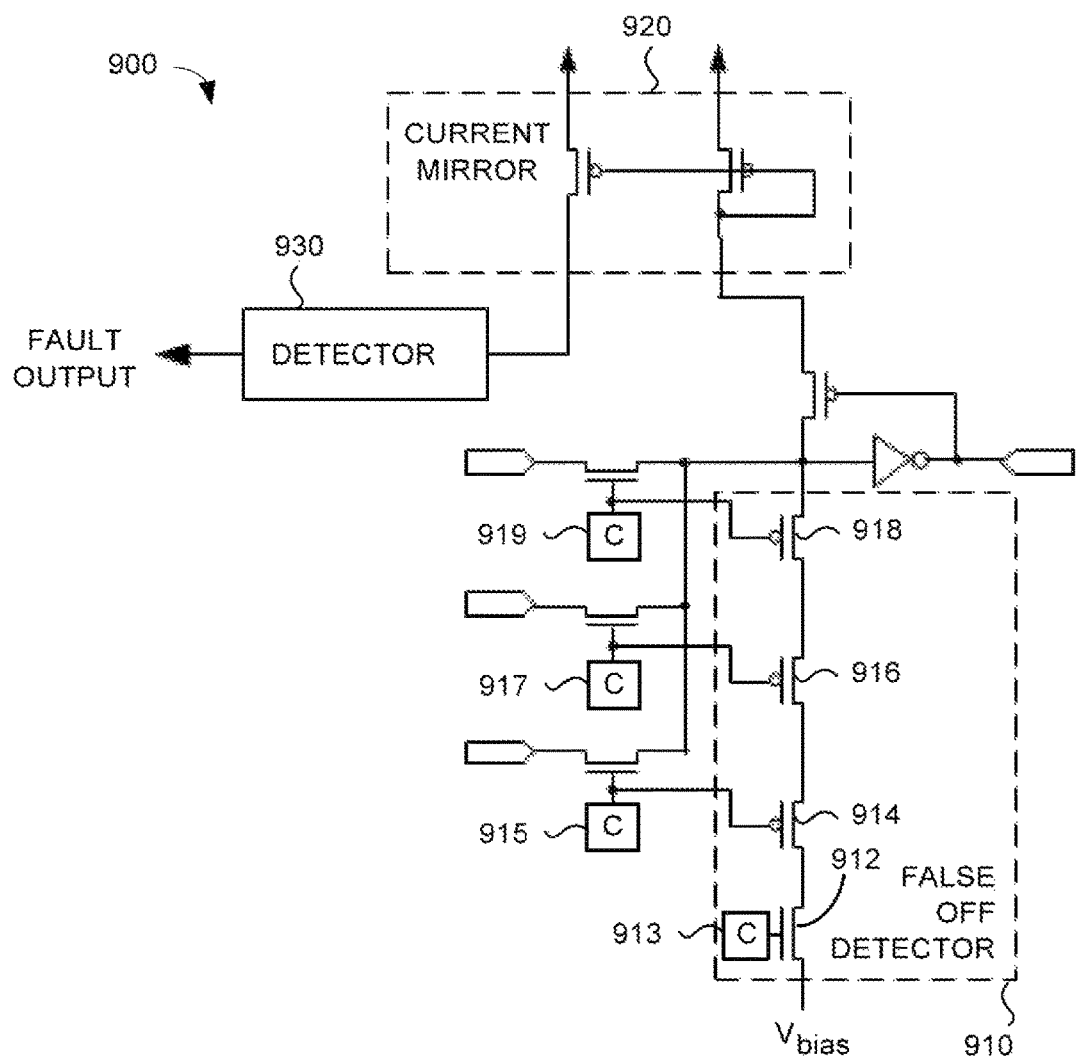
FIG. 9 is a diagram of an illustrative memory bit corruption detector that is configurable to distinguish a fault in a one-hot switching circuit from an unused switching circuit in accordance with an embodiment.
Figure 10:
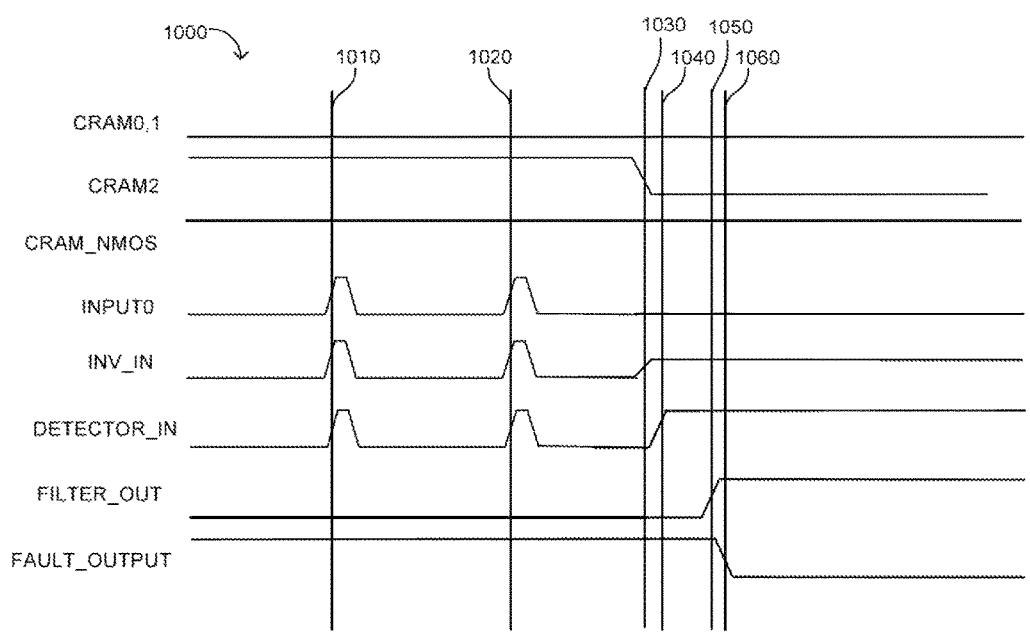
FIG. 10 is a diagram of an illustrative waveform diagram that shows the generation of the fault signal based on a configuration memory bit corruption in the circuit of FIG. 9 in accordance with an embodiment.

One solution to this problem may be to create a false off detector circuit that would enable a short circuit current through weak PMOS pull-up transistor 313 if the memory element that enables the single pass transistor is corrupted. An embodiment of such a false off detector circuit 910 is illustrated in FIG. 9. A corresponding waveform diagram is shown in FIG. 10.

As an example, FIG. 9 shows a switching circuit similar to switching circuit 310 (e.g., a routing multiplexer) of FIG. 3 that is monitored by current mirror 920 and detector 930.

The switching circuit may be a one-hot, fully decoded routing multiplexer that has three inputs, one output, three pass transistors that are each being: controlled by a memory element (i.e., memory elements 915, 917, and 919), a weak PMOS pull-up transistor, and an inverter.

The pass transistors may connect one of the inputs to the input of the inverter. The weak PMOS pull-up transistor is coupled between the inverter input and output to restore the voltage level at the inverter input, which may have dropped because of the pass transistors. In fact, the pass transistors may turn off as the voltage at the inverter input approaches a voltage level that corresponds to the supply voltage minus the threshold voltage of the pass transistor. To minimize this effect, the memory elements may store a boosted gate voltage Vcchg, which is higher than the supply voltage Vcc.

Each of the memory elements 915, 917, and 919 may be connected to the gate terminals of PMOS transistors 914, 916, and 918 in false off detector circuit 910, respectively. Coupled in series with the PMOS transistors, false off detector circuit 910 may include an NMOS transistor 912 with a gate terminal connected to memory element 913.

When the switching circuit is in use, only one of the three memory elements 915, 917, and 919 may store logic "1" while the other two memory elements store logic "0" to prevent a short circuit current between two inputs. Thus, exactly one of the three inputs is connected through the respective pass transistor and the inverter to the output. When the switching circuit is not in use, all three memory elements 915, 917, and 919 may store logic "0", thereby effectively decoupling the three inputs from the output.

As an example, consider the scenario in which memory elements 919 and 913, illustrated as CRAM2 and CRAM_NMOS in FIG. 10, store logic "1", and memory elements 915 and 917, illustrated as CRAM0,1 in FIG. 10, store logic "0".

Consider next that the signal at the input to the pass transistor controlled by the memory element 919 has transient current spikes as illustrated by INPUT0 at times 1010 and 1020 in FIG. 10. The transient current spikes result in transient current spikes in the weak PMOS pull-up transistor to restore the voltage level at the input of the inverter as illustrated by signal INV_IN in FIG. 10. The transient current spikes in the weak PMOS pull-up transistor may be reproduced by current mirror 920 at the input of detector circuit 930 as illustrated by current DETECTOR_IN in FIG. 10. However, a low-pass filter in detector circuit 930 may filter these high-frequency transient current spikes out as shown by signal FILTER_OUT in FIG. 10 and thereby suppress a false error warning by the detector.

Consider now, that a single-event upset (SEU) corrupts memory element 919 such that all memory elements are now logic "0". This is illustrated in the waveform diagram of FIG. 10 by the transition of signal CRAM2 from logic "1" to logic "0" at time 1030.

In this configuration, the memory elements 915, 917, and 919 may store logic "0" and the memory element 913 may store logic "1" . Thus, the false off detector circuit 910 may enable a conducting path between the drain of the weak PMOS pull-up transistor and bias voltage Vbias. The. bias voltage may be selected such that a short circuit current continuously flows through the weak PMOS pull-up transistor.

Current mirror 920 may reproduce the short circuit current at the input of detector circuit 930 as illustrated by current DETECTOR_IN at time 1040 in FIG. 10. As a result, a low-pass filter in detector circuit 1040 (e.g., the low-pass filter built from resistor 514 and capacitor 516 of detector circuit 510 in FIG. 5) may let the short circuit current pass as illustrated by signal FILTER_OUT in FIG. 10 and, as a result, the detector circuit 930 may indicate a fault.

NMOS pass transistor 912 and memory element 913 are necessary to keep the bias voltage disconnected from the drain of weak PMOS pull-up transistor when the memory elements 915, 917, and 919 are all intentionally at a state of logic "0". NMOS pass transistor 912 and memory element 913 may be shared among more than one switching circuit that are always jointly enabled or disabled.

False off detector circuit 910 is merely illustrative. If desired the order of the NMOS and PMOS pass transistors may change. For example, the NMOS pass transistor may be placed close to the input of the inverter and weak PMOS pull-up transistor to isolate the pull-down whenever the switching circuit is in use.

Figure 11:
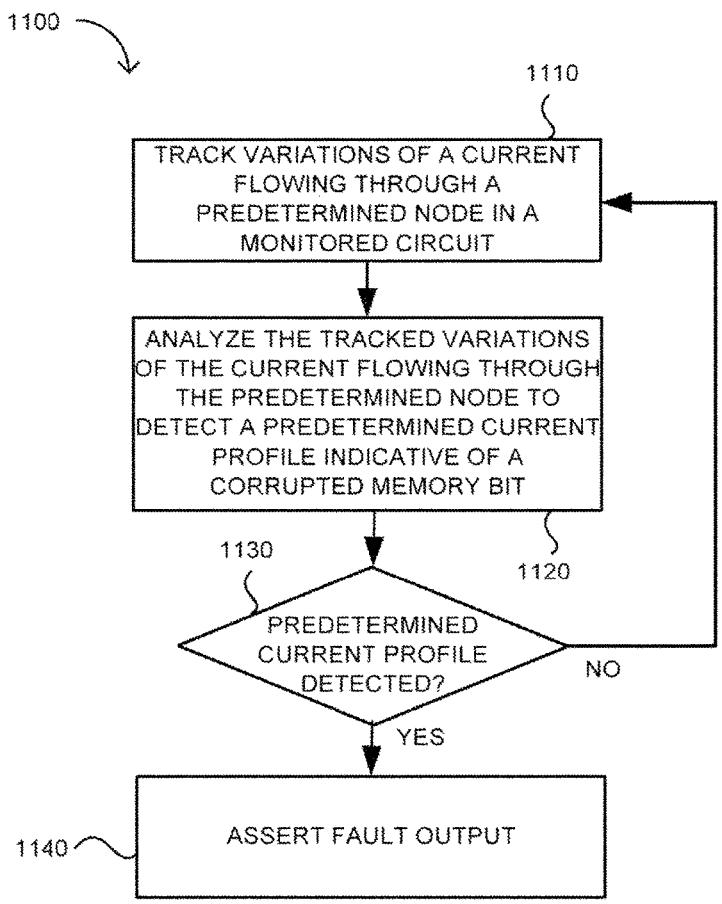
FIG. 11 is a flow chart of illustrative steps for operating a memory bit corruption detection circuit to detect a corrupted memory bit in a monitored circuit that is operated in user mode in accordance with an embodiment.

FIG. 11 is a flow chart of illustrative steps for operating a memory bit corruption detection circuit to detect a corrupted memory bit in a monitored circuit such as switching circuit 310 of FIG. 3 that is operated in user mode. During step 1110, the memory bit corruption detection circuit may track variations of a current flow through a predetermined node in a monitored circuit. For example, the memory bit corruption detection circuit may monitor the current flow through weak PMOS pull-up transistor 313 using current mirror 320. The memory bit corruption detection circuit may also track variations of another current flow through another predetermined node in the monitored circuit. For example, the memory bit corruption detection circuit may monitor more than one circuit, or in other words, multiple circuits may share the same current sensing circuit and detector such as illustrated in FIG. 7, where buffer and driver circuits 720 and 730 share current mirror 710 and detector 740.

During step 1120, the memory bit corruption detection circuit may analyze the tracked variations of the current flow through the predetermined node to detect a predetermined current profile indicative of a corrupted memory bit. For example, a detector circuit such as detector circuit 510 of FIG. 5 may filter out high-frequency transient current spikes that are typical of current flows that occur during normal operation and only detect low-frequency current flows that are indicative of shirt circuit currents as indicators of memory bit corruption.

During step 1130, the memory bit corruption detection circuit may determine whether a predetermined current profile was detected in either the predetermined node or the other predetermined node. In response to determining that a predetermined current profile was detected in either the predetermined node or the other predetermined node, memory bit corruption detection circuit may assert a fault output signal during step 1140. For example, one of the detector circuit 510 and the other detectors 530 may pull the fault output of FIG. 5 low, thereby indicating that a memory bit corruption has been detected.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAS), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of detecting memory bit corruption is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
    circuitry controlled by a plurality of data bits;
    a current sensing circuit that monitors a current flow through a predetermined node in the circuitry and that generates a corresponding current detection signal based on the monitored current flow;
    a fault detection circuit that receives the current detection signal from the current sensing circuit and that asserts a fault signal when at least one bit in the plurality of data bits is corrupted;
    a transistor coupled to the predetermined node; and
    a false off detector circuit coupled in series between the transistor and a bias voltage terminal, wherein the false off detector circuit distinguishes between corruption of the at least one bit in the plurality of data bits and a state in which the plurality of data bits controls the circuitry to be unused, and wherein the corruption of the at least one bit in the plurality of data bits generates the current flow through the predetermined node and through the false off detector circuit.

2. The integrated circuit of claim 1, wherein the fault detection circuit detects a current profile that is associated with the at least one corrupted bit in the plurality of data bits.

3. The integrated circuit of claim 2, wherein the fault detection circuit further comprises:
    a configuration memory bit that defines at least one parameter of the detectable current profile.

4. The integrated circuit of claim 1, wherein the current sensing circuit comprises a current mirror circuit that is coupled to the predetermined node through the transistor.

5. The integrated circuit of claim 1, wherein the current sensing circuit comprises a voltage divider circuit.

6. The integrated circuit of claim 1, further comprising:
    additional circuitry controlled by an additional plurality of data bits, wherein the current sensing circuit also monitors another current flow through a predetermined node in the additional circuitry, and wherein the current sensing circuit generates a corresponding additional current detection signal based on the additionally monitored current flow.

7. The integrated circuit of claim 1, further comprising:
    additional circuitry controlled by an additional plurality of data bits; and
    an additional current sensing circuit that monitors another current flow through a predetermined node in the additional circuitry, wherein the additional current sensing circuit generates an additional current detection signal based on the other monitored current flow, and wherein the fault detection circuit receives the additional current detection signal from the additional current sensing circuit and generates a fault signal when at least one bit in the additional plurality of data bits is corrupted.

8. The integrated circuit of claim 1, wherein the circuitry comprises a pass gate multiplexer.

9. The integrated circuit of claim 8, wherein the circuitry is implemented using programmable logic circuitry.

10. The integrated circuit of claim 1, wherein the fault detection circuit further comprises:
a filter circuit that receives the current detection signal from the current sensing circuit and that suppresses predetermined waveforms of the current detection signal, wherein the predetermined waveforms are not associated with a corrupted data bit.

11. The integrated circuit of claim 10, wherein at least one parameter of the filter circuit is user configurable.

12. The integrated circuit of claim 10, wherein the filter circuit further comprises:
a low-pass filter circuit that suppresses high frequency transitions in the current detection signal.

13. The integrated circuit of claim 1, wherein the fault detection circuit detects a short circuit current between first and second power supply lines when the at least one bit in the plurality of data bits is corrupted.

14. The integrated circuit defined in claim 1, further comprising an inverter, wherein the predetermined node is coupled between the false off detector circuit, the transistor, and an input of the inverter.

15. The integrated circuit defined in claim 14, wherein the transistor has a gate terminal coupled to an output of the inverter and a drain terminal coupled to the predetermined node.

16. A method for detecting a corrupted memory bit in a circuit, comprising:
monitoring a current flowing through a predetermined node in the circuit;
analyzing the monitored current to detect a current waveform indicative of the corrupted memory bit; and
asserting a fault signal in response to detecting the current waveform, wherein analyzing the monitored current further comprises:
suppressing variations within a first frequency range of the monitored current prior to analyzing the monitored current.

17. The method of claim 16, wherein analyzing the monitored current further comprises:
setting a configuration memory bit that modifies at least one parameter of the current waveform that is indicative of the corrupted memory bit.

18. The method of claim 17, wherein analyzing the monitored current further comprises:
with a current sensing circuit, inducing an additional current through an additional node, wherein the additional current is based on the monitored current.

19. The method of claim 16, wherein detecting the current waveform further comprises:
detecting variations within a second frequency range of the current flowing through the predetermined node.

20. A switching circuit, comprising:
a routing circuit that includes a plurality of storage elements that store configuration bits for controlling the routing circuit;
a current sensing circuit that monitors a current flow through an internal node of the routing circuit, wherein corruption of one of the configuration bits causes the monitored current flow to exhibit a predetermined current profile;
a fault detection and reporting circuit that analyzes the monitored current flow from the current sensing circuit and generates a fault signal when the analyzed current flow exhibits the predetermined current profile;
an inverter with an output; and
a transistor with a gate terminal coupled to the output of the inverter and with a drain terminal coupled to the internal node.

21. The switching circuit of claim 20, wherein the fault detection and reporting circuit further comprises:
a low-pass filter circuit that filters high-frequency transitions of the monitored current flow.

22. The switching circuit of claim 20, wherein the current sensing circuit is coupled in series with the transistor, and wherein the current sensing circuit monitors the current flow through the transistor.

23. The switching circuit of claim 20, further comprising:
a false off detector circuit that enables the distinction between corruption of one of the configuration bits and configuration bits that configure the switching circuit to be unused, wherein the false off detector circuit is coupled in series with the transistor, wherein the configuration bits control the false off detector circuit, and wherein the corruption of one of the configuration bits causes a current flow that exhibits the predetermined current profile through the internal node of the routing circuit.

24. The switching circuit of claim 20, further comprising:
a pass transistor coupled to the internal node, wherein a gate terminal of the pass transistor is controlled by a bit of the configuration bits.

* * * * *